US009603292B2

(12) United States Patent
Kurz et al.

(10) Patent No.: US 9,603,292 B2
(45) Date of Patent: Mar. 21, 2017

(54) ALUMINUM EMI/RF SHIELD WITH FINS

(71) Applicant: A.K. Stamping Company, Inc., Mountainside, NJ (US)

(72) Inventors: Arthur Kurz, New Vernon, NJ (US); Michael Schneider, Montgomery, NJ (US); Bret Barry, Fincastle, VA (US)

( * ) Notice: Subject to any disclaimer, the term of this patent is extended or adjusted under 35 U.S.C. 154(b) by 0 days.

(21) Appl. No.: 14/967,970

(22) Filed: Dec. 14, 2015

(65) Prior Publication Data

US 2016/0100511 A1    Apr. 7, 2016

Related U.S. Application Data

(63) Continuation-in-part of application No. 14/735,437, filed on Jun. 10, 2015, which is a continuation of application No. 14/210,561, filed on Mar. 14, 2014.

(60) Provisional application No. 61/788,151, filed on Mar. 15, 2013.

(51) Int. Cl.
| | |
|---|---|
| *H05K 9/00* | (2006.01) |
| *H05K 7/20* | (2006.01) |
| *H01L 21/48* | (2006.01) |
| *H01L 23/367* | (2006.01) |
| *H01L 23/552* | (2006.01) |

(52) U.S. Cl.
CPC ....... *H05K 9/0026* (2013.01); *H01L 21/4882* (2013.01); *H01L 23/3672* (2013.01); *H01L 23/552* (2013.01); *H05K 7/2039* (2013.01); *H05K 9/0032* (2013.01); *H01L 2924/0002* (2013.01)

(58) Field of Classification Search
CPC ............. H01L 21/4882; H01L 23/3672; H01L 23/552; H01L 2924/0002; H05K 7/2039; H05K 9/0026; H05K 9/0032
USPC ......................................... 361/816, 818, 820
See application file for complete search history.

(56) References Cited

U.S. PATENT DOCUMENTS

| | | | | |
|---|---|---|---|---|
| 7,104,311 | B1 * | 9/2006 | Teng .......................... | F28F 3/02 |
| | | | | 165/121 |
| 7,165,601 | B1 * | 1/2007 | Hashimoto ............... | G06F 1/20 |
| | | | | 165/185 |
| 2004/0052064 | A1 * | 3/2004 | Oliver ................. | H01L 23/4093 |
| | | | | 361/816 |
| 2007/0211436 | A1 * | 9/2007 | Robinson ............... | H01L 23/552 |
| | | | | 361/719 |
| 2008/0101028 | A1 * | 5/2008 | Sung ..................... | B21D 53/04 |
| | | | | 361/709 |
| 2009/0139692 | A1 * | 6/2009 | Lin ..................... | H01L 23/3672 |
| | | | | 165/80.3 |

(Continued)

*Primary Examiner* — Anthony Haughton
*Assistant Examiner* — Yahya Ahmad
(74) *Attorney, Agent, or Firm* — McCarter & English, LLP

(57) ABSTRACT

A shield made from aluminum (AL) or an aluminum-based alloy coated with a solderable plating such as nickel or tin provides thermal improvement over existing shielding materials. The shield for electronic components on a circuit board comprising a base having an upper surface and one or more sidewalls extending from a perimeter of the upper surface, the sidewalls configured to engage a fence of the circuit board, and a fin array attached to the upper surface of the base, the fin array having a plurality of stackable fins, each of the stackable fins having a wall and one or more engagement tabs extending from one or more edges of the wall, the engagement tabs interlocking the plurality of stackable fins together.

18 Claims, 15 Drawing Sheets

(56) References Cited

U.S. PATENT DOCUMENTS

| | | | |
|---|---|---|---|
| 2009/0283246 A1* | 11/2009 | Chen | F28D 15/0275 |
| | | | 165/80.3 |
| 2009/0321049 A1* | 12/2009 | Chen | H01L 23/3672 |
| | | | 165/80.3 |
| 2010/0236755 A1* | 9/2010 | Li | H01L 23/3672 |
| | | | 165/80.3 |
| 2014/0307392 A1* | 10/2014 | Kurz | H05K 9/0026 |
| | | | 361/720 |

* cited by examiner

ALUMINUM EMI/RF SHIELD WITH FINS

CROSS-REFERENCE TO RELATED APPLICATION

This application is a Continuation-In-Part application of, and claims priority to U.S. patent application Ser. No. 14/735,437 filed on Jun. 10, 2015, which claims priority to U.S. patent application Ser. No. 14/210,561 filed on Mar. 14, 2014, which claims priority to U.S. Provisional Patent Application No. 61/788,151 filed on Mar. 15, 2013, the entire contents of each of which are hereby incorporated by reference.

BACKGROUND OF THE INVENTION

Field of the Invention

The present invention relates to an EMI/RF shield for circuitry on a circuit board and more particularly an EMI/RF shield comprised of aluminum or an aluminum-based alloy and plated with a solderable material and fins.

Related Art

Traditional EMI/RF shielding materials include but are not limited to nickel silver, tin plated cold rolled steel or SPTE, stainless steel, brass, or phosphor bronze materials which are good for formability and EMI/RF shielding but are poor from a thermal performance perspective or cost prohibitive for a shielding application.

One piece shields are typically used on thin devices where the height is a concern and replaceable lids cannot be used due to height restrictions. One piece shields are also used for cost saving solutions when compared to two piece shields. Two piece shielding solutions are generally used for reworkability and are typically higher cost.

SUMMARY

A shield made from aluminum (AL) or an aluminum-based alloy coated with a solderable plating such as nickel or tin provides thermal improvement over existing shielding materials. Plated aluminum offers enhanced thermal performance while also offering a significant weight reduction when compared to commonly used shielding materials. Due to the higher thermal conductivity of aluminum and the ability to solder the shield directly to the board, the shield will also transfer heat from the top surface down the shield side walls and "dump" the heat into the circuit board. Heat transfer is enhanced with the use of fins attached to the surface of the shield to transfer heat away from the device offering a lower operating temperature improving device life and reliability.

BRIEF DESCRIPTION OF THE DRAWINGS

The foregoing features will be apparent from the following Detailed Description, taken in connection with the accompanying drawings, in which.

DETAILED DESCRIPTION OF THE INVENTION

An EMI/RF shield is made of aluminum or an aluminum-based alloy to take advantage of the thermal performance of aluminum. To allow for soldering, the aluminum material is plated with a solderable material such as nickel or tin.

Figure 1:
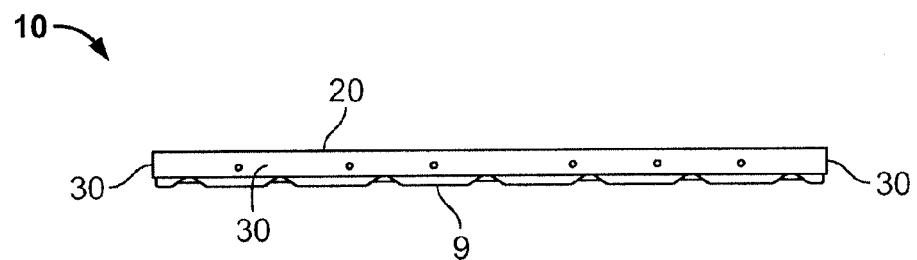
FIG. 1 is a side view of a two-piece EMI/RF shield consisting of a fence and lid.

FIG. 1 is a side view of a heat shield made of aluminum or an aluminum-based alloy, generally indicated at 10. The shield lid 10 is attached to a fence 9 which is attached to a circuit board and surrounds circuitry. Other ways of attachment of the shield 10 to a circuit board circuitry are considered to be written within the scope of this disclosure. The shield 10 includes an upper surface 20 and may include one or more side walls 30, forming a lid that can be positioned over a circuit to provide for electromagnetic interference and radio frequency shielding. For example, the shield could have four walls and a top wall to form a five-sided lid. A benefit of using aluminum or an aluminum-based alloy is the enhanced thermal performance and weight reduction as compared to other shielding materials. Because of the thermal conductivity of the aluminum, the shield transfers heat from the top surface down the side walls of the shield and can dump the heat into the circuit board where it is dissipated.

Figure 2:
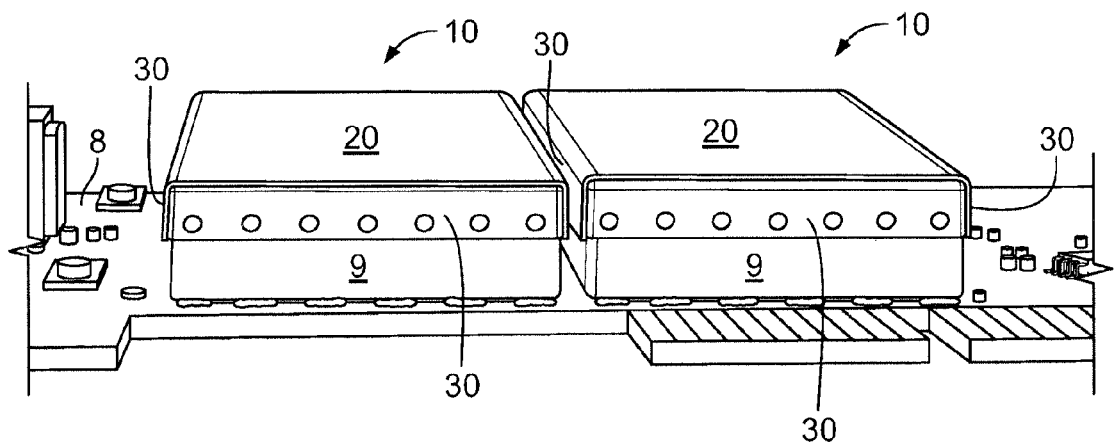
FIG. 2 is a perspective view showing two two-piece EMI/RF shields each with a lid attached to a fence around circuitry on a board.

FIG. 2 is a perspective view showing two fences 9 on a circuit board 8 with shields lids 10 attached to the fences 9. All of the shields discussed herein could be one or two piece shields that could be attached to circuit boards by attachment to fences or in other ways known in the art. The shield can be attached to the fencing in any way known in the art, such as by soldering. The attachment can be snap down or as otherwise know in the art. The shields 10 include top wall 20 and side walls 30. The shields lids 10 are made of an aluminum or aluminum-based alloy plated with a solderable material such as nickel or tin. The fence 9 can be made of aluminum or an aluminum-based alloy plated with a solderable material such as nickel or tin to permit soldering of the shield. The aluminum containing shields disclosed herein can be manufactured in accordance with what is known in the art in connection with manufacturing shields of conventional shielding materials. The aluminum material can be plated with nickel, tin or another solderable material before or after being formed into a lid configuration.

Figure 3:
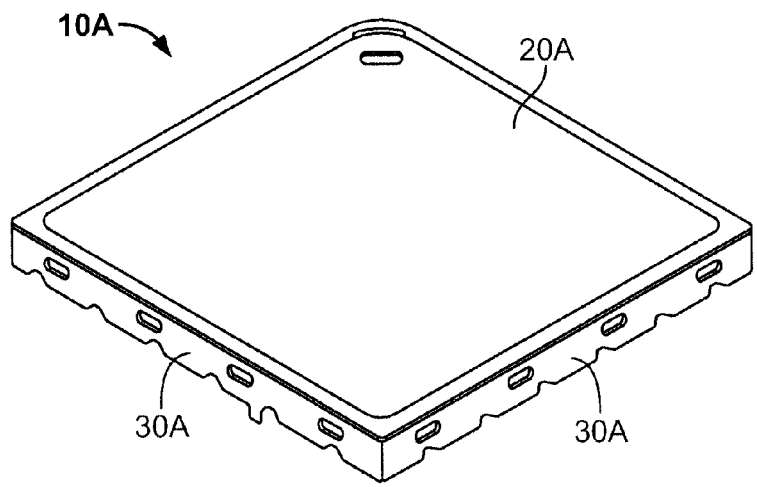
FIG. 3 is a perspective view showing a one piece shield that can be attached directly to a circuit board.

FIG. 3 is a perspective view showing a one piece shield 10A that could be made of aluminum or an aluminum-based alloy that can be attached directly to a circuit board. The shield 10A includes top wall 20A and side walls 30A. The shield 10A is made of aluminum or an aluminum-based alloy plated with a solderable material such as nickel or tin to permit soldering of the shield directly to the circuit board. The fence 9 are made of aluminum or an aluminum-based alloy plated with a solderable material such as nickel or tin to permit soldering of the shield. The aluminum containing shields disclosed herein can be manufactured in accordance with what is known in the art in connection with manufacturing shields of conventional shielding materials. The aluminum material can be plated with nickel, tin or another solderable material before or after being formed into a configuration with side walls. The shield could be peelable or non-peel. If it is a peel shield and if it is re-worked and the lid is removed, the fence is left behind attached to the board requiring a replacement lid that snaps on the existing fence.

Figure 4:
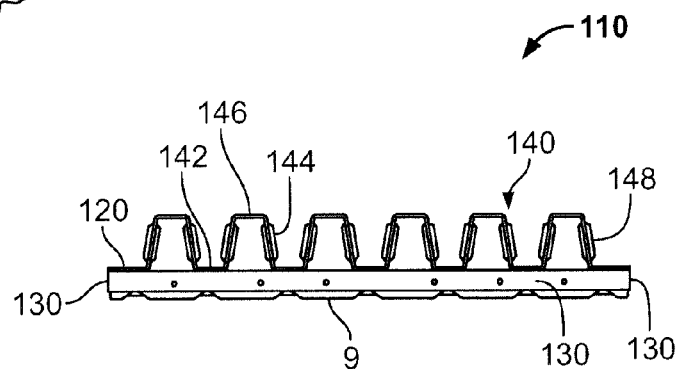
FIG. 4 is a side view of another EMI/RF shield with heat dissipating fins attached to the shield.

FIG. 4 shows a shield generally indicated at 110 attached to a fence 9. The shield has a top wall 120 and may have one or more side walls 130. The shield includes heat dissipating fins generally indicated at 140 attached to the top wall. The fins 140 can be soldered to the top wall 120 of the shield 110. The fins can be made of the same material as the shield, e.g. aluminum or an aluminum-based alloy that can be plated with nickel, tin or other solderable material. Of course the fins can be made of an entirely different material than the shield, such as a conventional non-aluminum material, if desired. The fins can be shaped as desired in accordance with what is known in the art. The fins could be plated with a solderable material before or after the fins are shaped into final form. As shown in FIG. 4, fins 140 can have a series of valleys 142 for contact to and solderable connection with the top wall 120 of shield 110. The fins 140 can have a plurality of upstanding walls 144 and tops 146 connected between upstanding walls. Upstanding walls 144 can have further heat dissipating features such as further fins 148 to provide greater surface area for increased heat dissipation.

Figure 5:
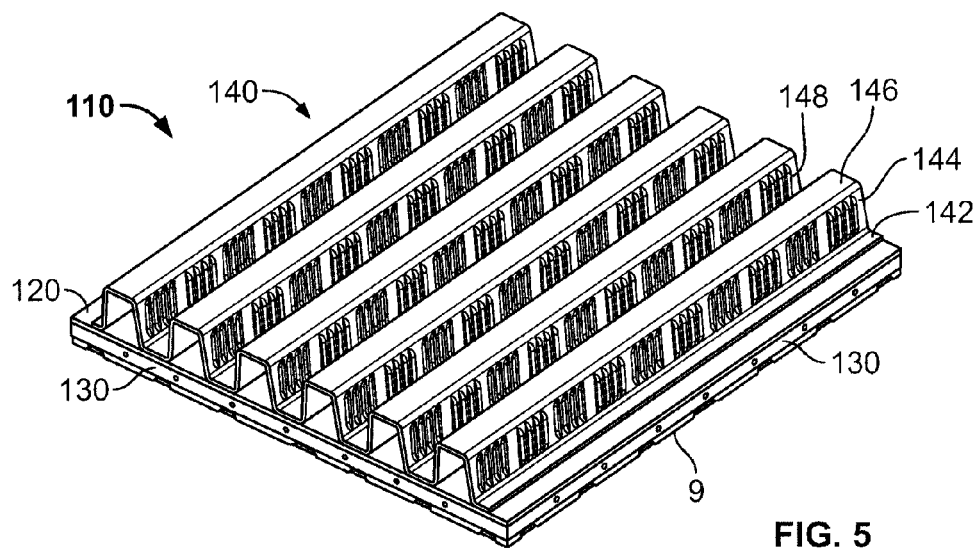
FIG. 5 is a perspective view of the shield shown in FIG. 4.

FIG. 5 is a perspective view of the shield with fins shown in FIG. 4. As discussed with respect to FIG. 3, the shield 110 includes a top 120 and may include side walls 130. The shield 110 is attached to fence 9 on a circuit board. Fins 140 include a series of valleys 142 wherein the fins 140 can be soldered to the top wall 120, a plurality of upstanding walls 144 and a plurality of top surfaces 146 which interconnect adjacent upstanding walls 144. Further, upstanding walls 144 may include further heat dissipation features such as additional fins 148.

Figure 6:
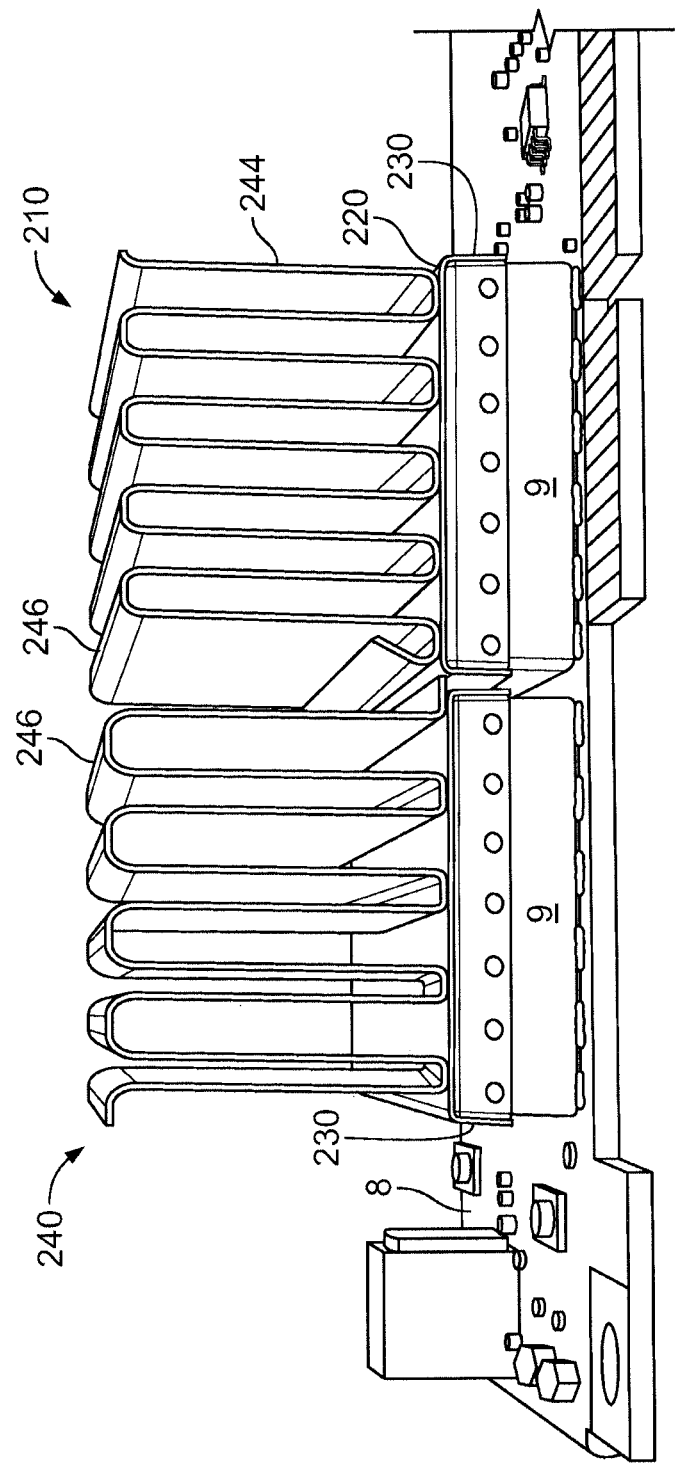
FIG. 6 is a perspective view of an EMI/RF shield with heat fins thereon.

FIG. 6 is a perspective view of another aluminum or aluminum-based shield with fins. The shields 210 includes a top wall 220 and may include side walls 230. The shields 210 are attached to fences 9 on a circuit board 8. Fins 240 include a series of valleys 242 that can be soldered to the top wall 220, a plurality of upstanding walls 244 and a plurality of top surfaces 246 which interconnect adjacent upstanding walls 244. As shown, the upstanding walls 244 can be configured to extend at right angles with respect to the top wall 220.

Figure 7:
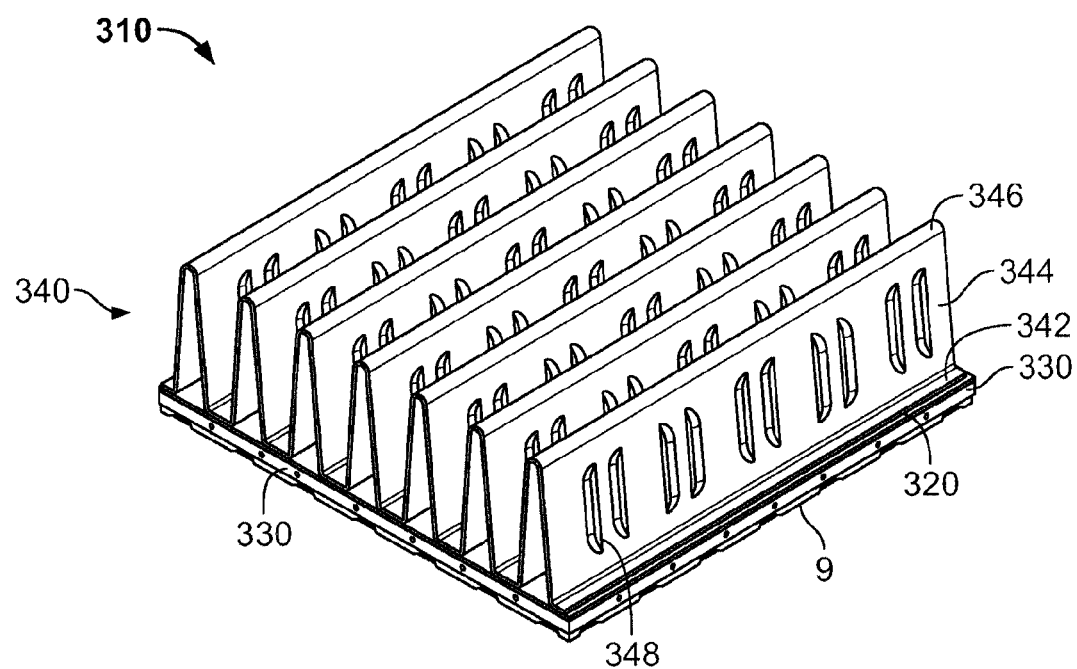
FIG. 7 is a perspective view of a EMI/RF shield with heat fins thereon.

FIG. 7 is a perspective view of another aluminum or aluminum-based shield with fins. The shield 310 includes a top wall 320 and may include side walls 330. The shield 310 is attached to fence 9 on a circuit board. Fins 340 include a series of valleys 342 wherein the fins 340 can be soldered to the top wall 320, a plurality of upstanding walls 344 and a plurality of top surfaces 346 which interconnect adjacent upstanding walls 344. As shown, the upstanding walls 344 of fins 340 can be configured to extend from the top wall at an angle other than a right angle from the top wall 320. Further, upstanding walls 344 may include further heat dissipation features such as additional fins 348.

The shields disclosed herein can be: single piece shields that are non-peelable or non-reworkable; single piece shields that are peelable/reworkable; two piece shields including a fence and lid both made using plated aluminum; two piece shields including a fence and lid, one component of which is plated aluminum (typically the lid) (the fence could use nickel silver, cold rolled steel or plated stainless steel); and two piece shields with soldered pre- or post-plated aluminum or copper (not limited to material selection) fin stock soldered to plated lid surface.

Low profile/low power devices such as mobile handsets, tablets, thin laptops may use either a one or two piece shield solution without soldered fin stock to the lid offering a thermal advantage over commonly used nickel silver and cold rolled shields.

High power applications such as RF modules, processor modules which typically are found in larger case structures (e.g. server chassis, wireless modems, set top boxes or cable boxes) which are typically force convection cooled. These devices can use plated fin stock to offer additional thermal improvement when used with the base plated aluminum fence and lid. Fin stock (formed, folded, stamped, etc.) is soldered to the top surface of the EMI/RF shield lid increasing thermal performance.

Figure 8:
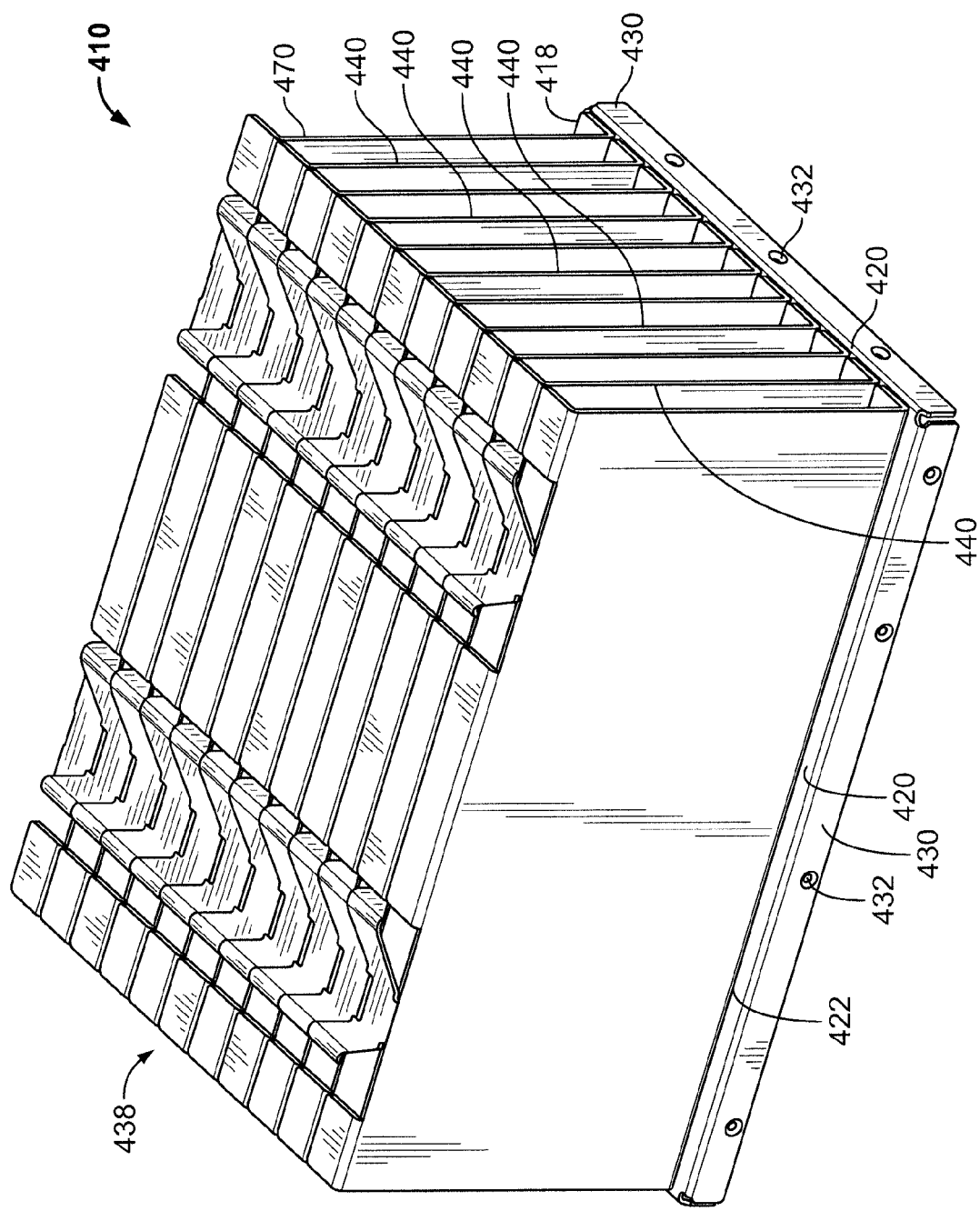
FIG. 8 is a top perspective of a EMI/RF shield.
Figure 9:
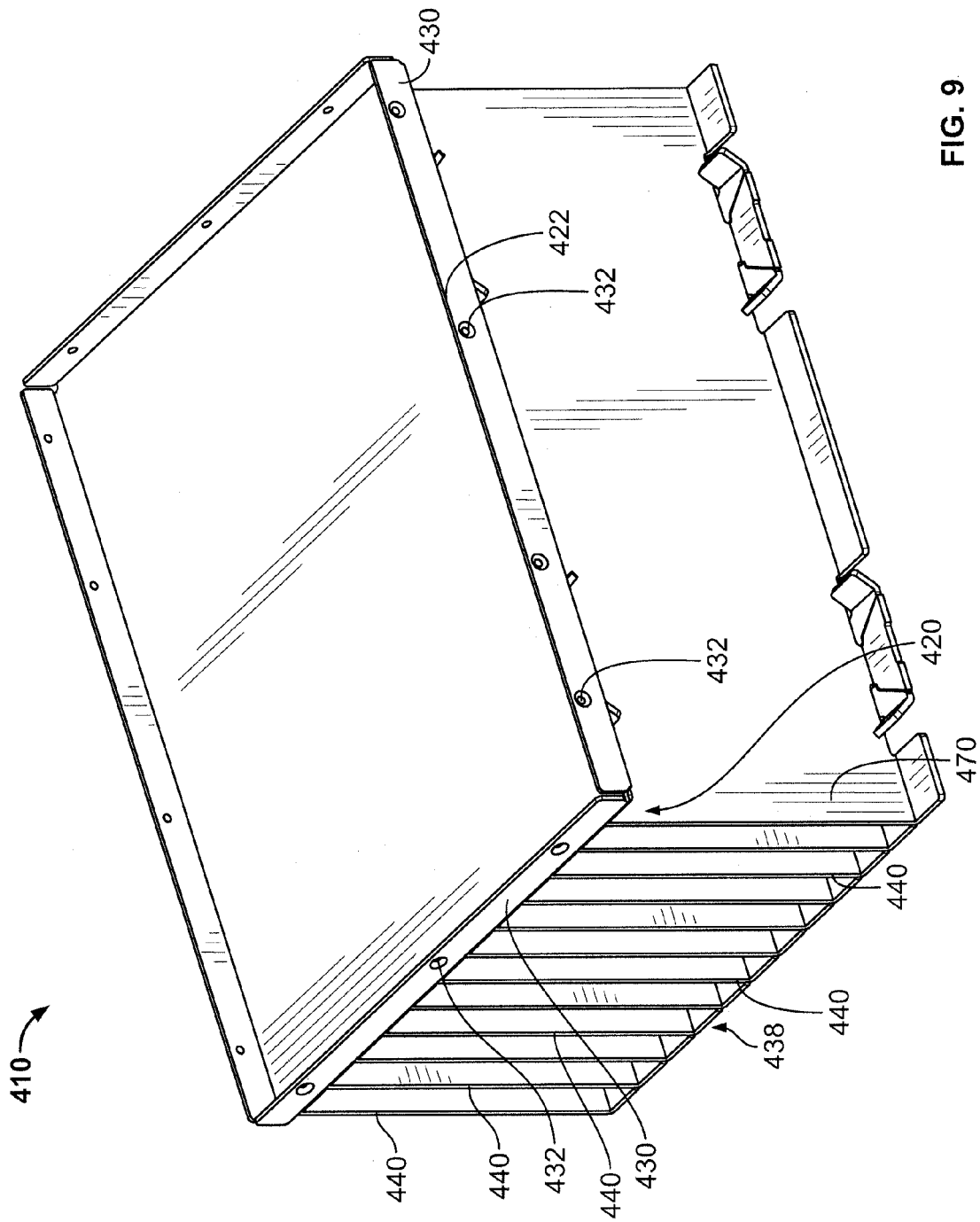
FIG. 9 is a bottom perspective of a EMI/RF shield.
Figure 10:
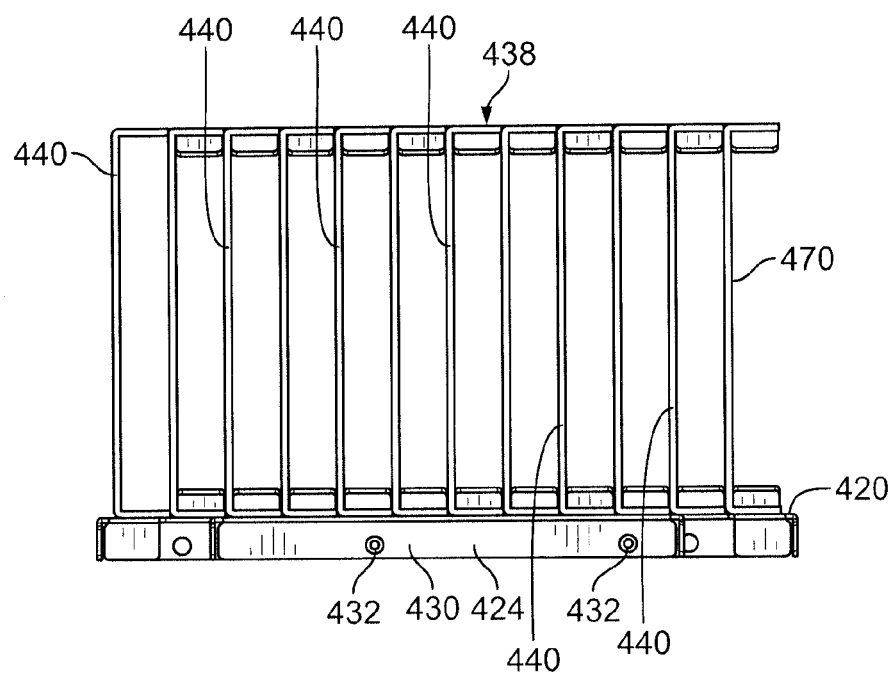
FIG. 10 is a right side view of a EMI/RF shield.
Figure 11:
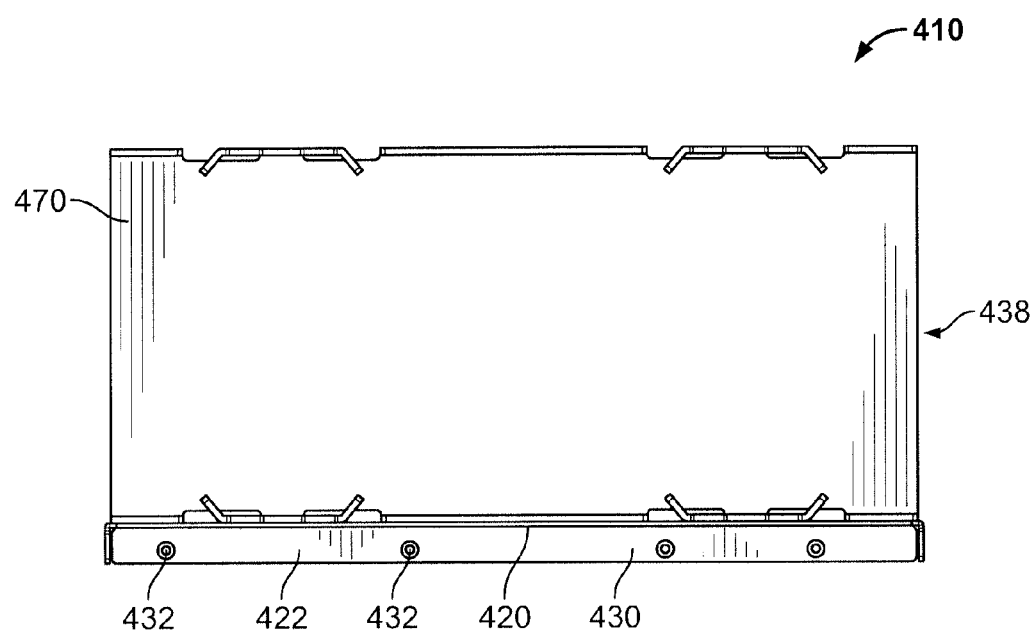
FIG. 11 is a rear view of a EMI/RF shield.
Figure 12:
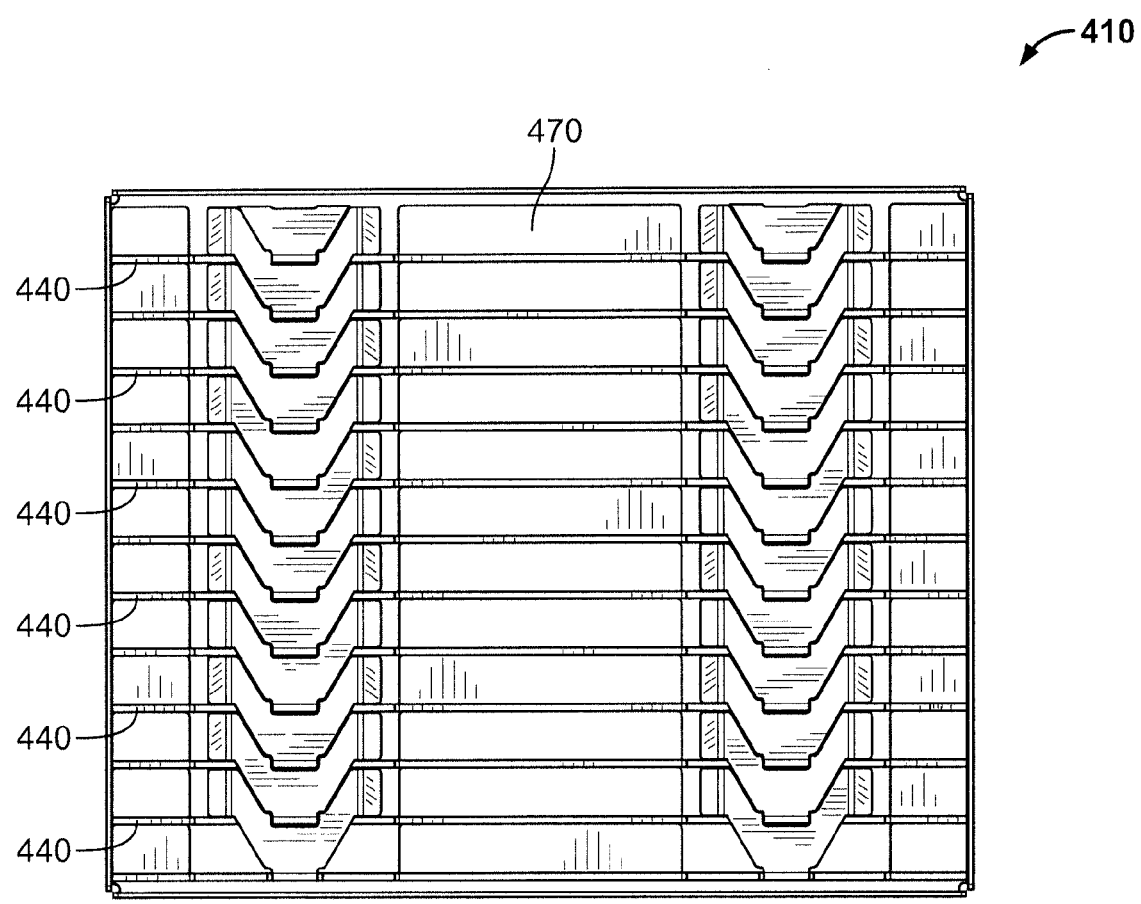
FIG. 12 is a top view of a EMI/RF shield.

FIGS. 8-12 are views of a shield with a fin array. More specifically, FIG. 8 is a top perspective, FIG. 9 is a bottom perspective, FIG. 10 is a right side view, FIG. 11 is a rear view, and FIG. 12 is a top view of the shield 410. The shield 410 includes an upper surface 420 and fin array 438. The upper surface 420 may include one or more sidewalls 430, that depend from a perimeter of the upper surface 420. The sidewalls 430 could be continuous, or could have gaps to facilitate mounting. Further, the sidewalls 430 could include one or more inwardly protruding dimples 432 that could engage the outer surface of a fence, such that the shield 410 is secured to the fence and positioned over a circuit to provide electromagnetic interference and radio frequency shielding. The inner surface of sidewalls 430 of shield 410 could be sized to fit over (e.g., engage) the outer surface of a fence thereby allowing the dimples 432 to engage the outer surface of the fence. Alternatively, the shield 410 could engage the fence without the dimples 432. Attachment of the shield 410 to the fence could by a friction fit, or welding, or other attachment.

The fin array 438 could be attached to the upper surface 420 of the shield 410. The fin array 438 includes one or more stackable fins 440 and may include an end fin 470. The fin array 438 could be made up of any number of stackable fins 440 depending on the heat shielding requirement. The stackable fins 440 and end fin 470 are spaced apart at a distance that can vary in accordance with heat shielding requirements. The stackable fins 440 each include nestable engagement tabs with bendable portions to interlock the stackable fins together. The stackable fins 440 also include non-engagement tabs which could facilitate interlocking of the stackable fins and/or provide structural support between the stackable fins 440.

Figure 13:
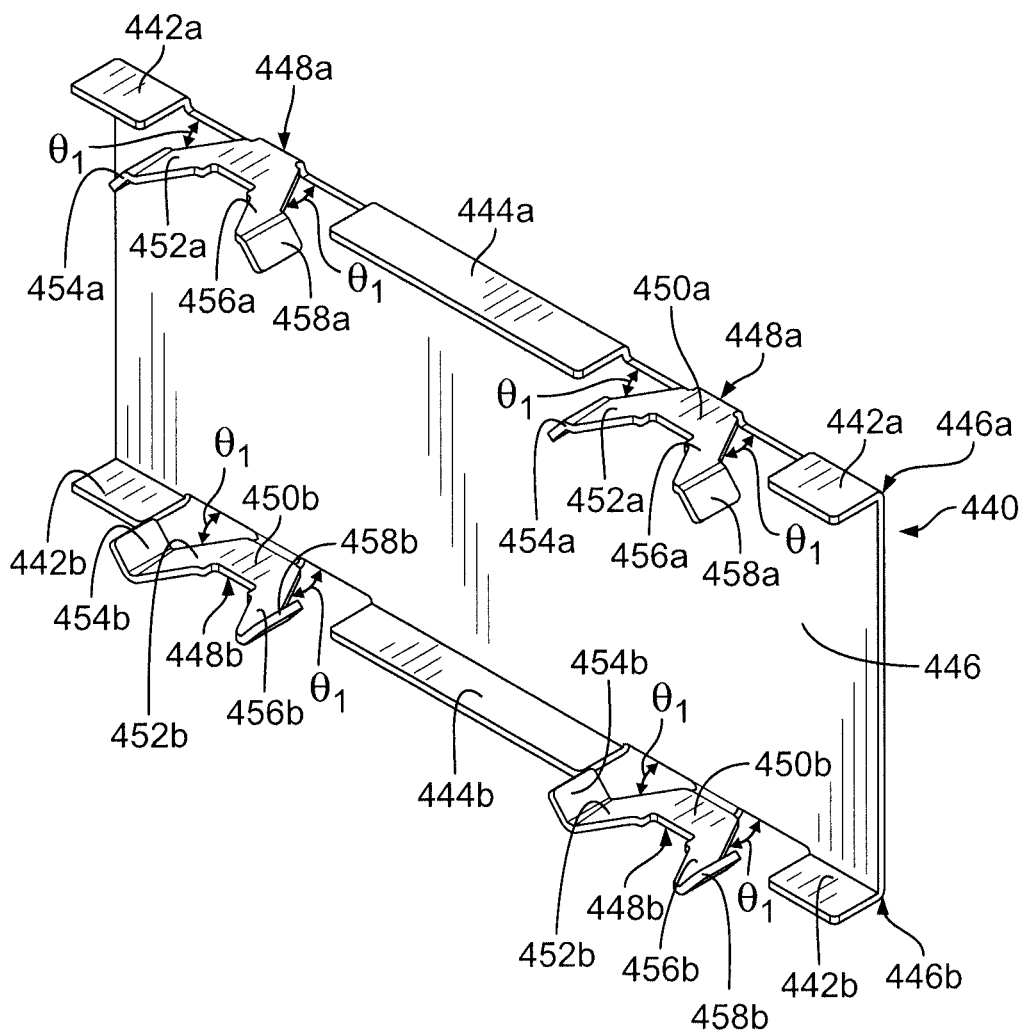
FIG. 13 is a perspective view of a stackable fin of a EMI/RF shield.

FIG. 13 is a perspective view of a stackable fin 440. The stackable fin 440 includes a generally planar surface or wall 446 having a top side 446a (e.g., first side) and a bottom side 446b (e.g., second side), top end tabs 442a at first and second ends of the top side, bottom end tabs 442b at first and second ends of the bottom side, top and bottom middle tabs 444a and 444b, top stackable engagement tabs 448a on the top side of wall 446 and bottom stackable engagement tabs 448b on the bottom side of wall 446. Accordingly, the components of the top side 446a could mirror the components of the bottom side 446b. The top and bottom end tabs 442a and 442b could be rectangular in shape and could extend perpendicularly, or at any other angle, from wall 446. Top and bottom end tabs 442a and 442b and top and bottom middle tabs 444a and 444b all extend in the same direction. Top and bottom middle tabs 444a and 444b could be rectangular in shape and could extend perpendicularly, or at any other angle, from wall 446. Top and bottom middle tabs 444a and 444b could be longer than top and bottom end tabs 442a and 442b. However, top and bottom middle tabs 444a and 444b could extend the same distance from wall 446 as top and bottom end tabs 442a and 442b.

Each of the two top stackable engagement tabs 448a includes a body 450a that can be trapezoidal in shape and first and second arms 452a and 456a extend outward to form acute angles $\theta_1$ with the wall 446. The first arm 452a includes a bendable finger 454a which extends outward from the first arm 452a. The second arm 456a includes a bendable finger 458a which extends outward from the second arm 456a. The bendable fingers 454a and 458a extend opposite from each other. Similarly, each of the two bottom stackable engagement tabs 448b includes a body 450b that can be trapezoidal in shape and first and second arms 452b and 456b which extend outward to form acute angles $\theta_1$ with the wall 446. As described with top stackable engagement tabs 448a, the first arm 452b includes a bendable finger 454b which extends outward from the first arm 452b. Second arm 456b includes a bendable finger 458b which extends outward from the second arm 456b. The bendable finger 454b and 458b extend opposite from each other. Each top stackable engagement tab 448a is located between the top end tab 442a and top middle tab 444a. Similarly, each bottom stackable engagement tab 448b is located between the bottom end tab 442b and bottom middle tab 444b. Body 450a and body 450b are shaped to receive a trapezoidal end tab 472a or 472b of an end fin 470 (see FIG. 14).

Figure 14:
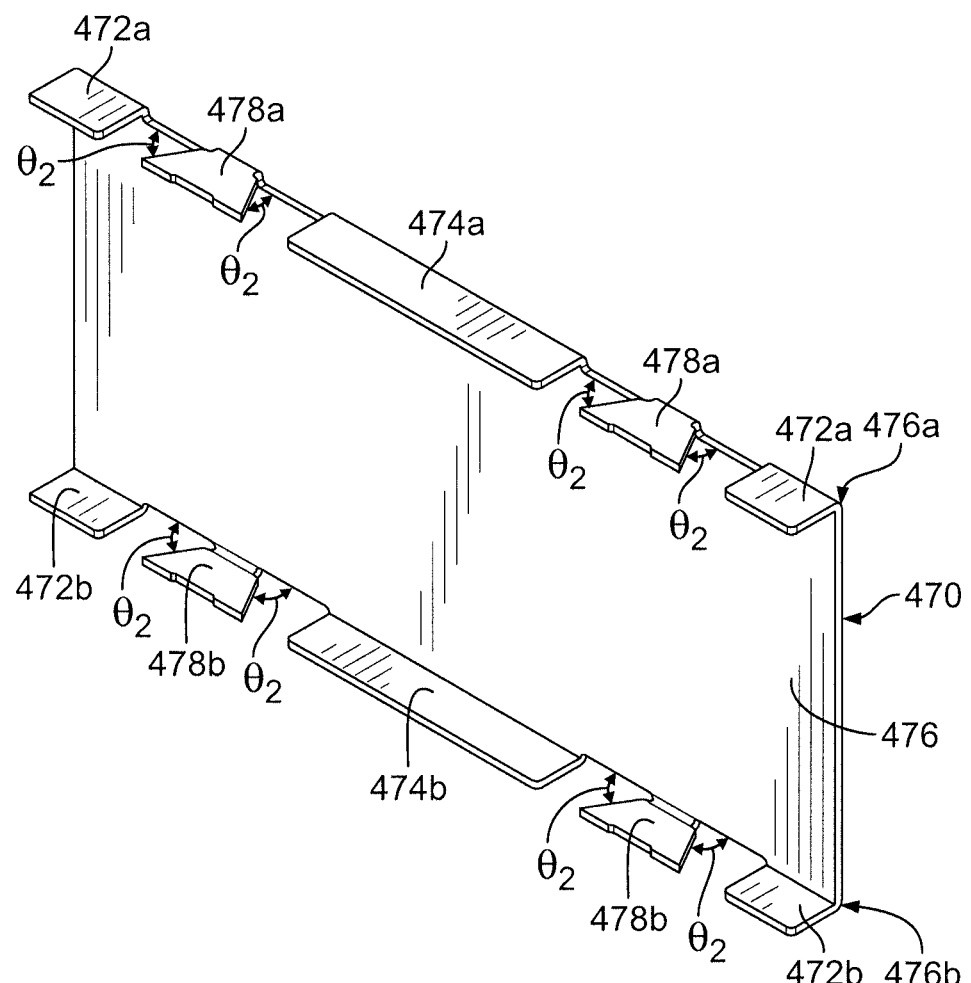
FIG. 14 is a perspective view of an end fin of a EMI/RF shield.

FIG. 14 is a perspective view of an end fin 470. The end fin 470 includes a wall 476 having a top side 476a and a bottom side 476b, top end tabs 472a at first and second ends of the top side, bottom end tabs 472b at first and second ends of the bottom side, top and bottom middle tabs 474a and 474b, top stackable end tabs 478a on the top side of wall 476, and bottom stackable end tabs 478b on the bottom side of wall 476. Accordingly, the components of the top side could mirror the components of the bottom side.

The top and bottom end tabs 472a and 472b could be rectangular in shape and could extend perpendicularly from wall 476, or at any other angle. Top and bottom end tabs 472a and 472b and top and bottom middle tabs 474a and 474b could be rectangular in shape and could extend perpendicularly from wall 476, or at any other angle. Top and bottom middle tabs 474a and 474b could extend longer (e.g., along the length of the wall) than top and bottom end tabs 472a and 472b. However, top and bottom middle tabs 474a and 474b could extend the same distance from the wall 476 as top and bottom end tabs 472a and 472b. Top and bottom stackable end tabs 478a and 478b could be trapezoidal in shape and could extend perpendicularly from wall 476 such that the shorter of the parallel sides of the trapezoid is attached to the wall 476. Each angled side of top and bottom stackable end tabs 478a and 478b forms an acute angle $\theta_2$ with the surface of wall 476. Each top stackable end tab 478a is located between the top end tab 472a and top middle tab 474a. Similarly, each bottom stackable end tab 478b is located between the bottom end tab 472b and bottom middle tab 474b.

Figure 15:
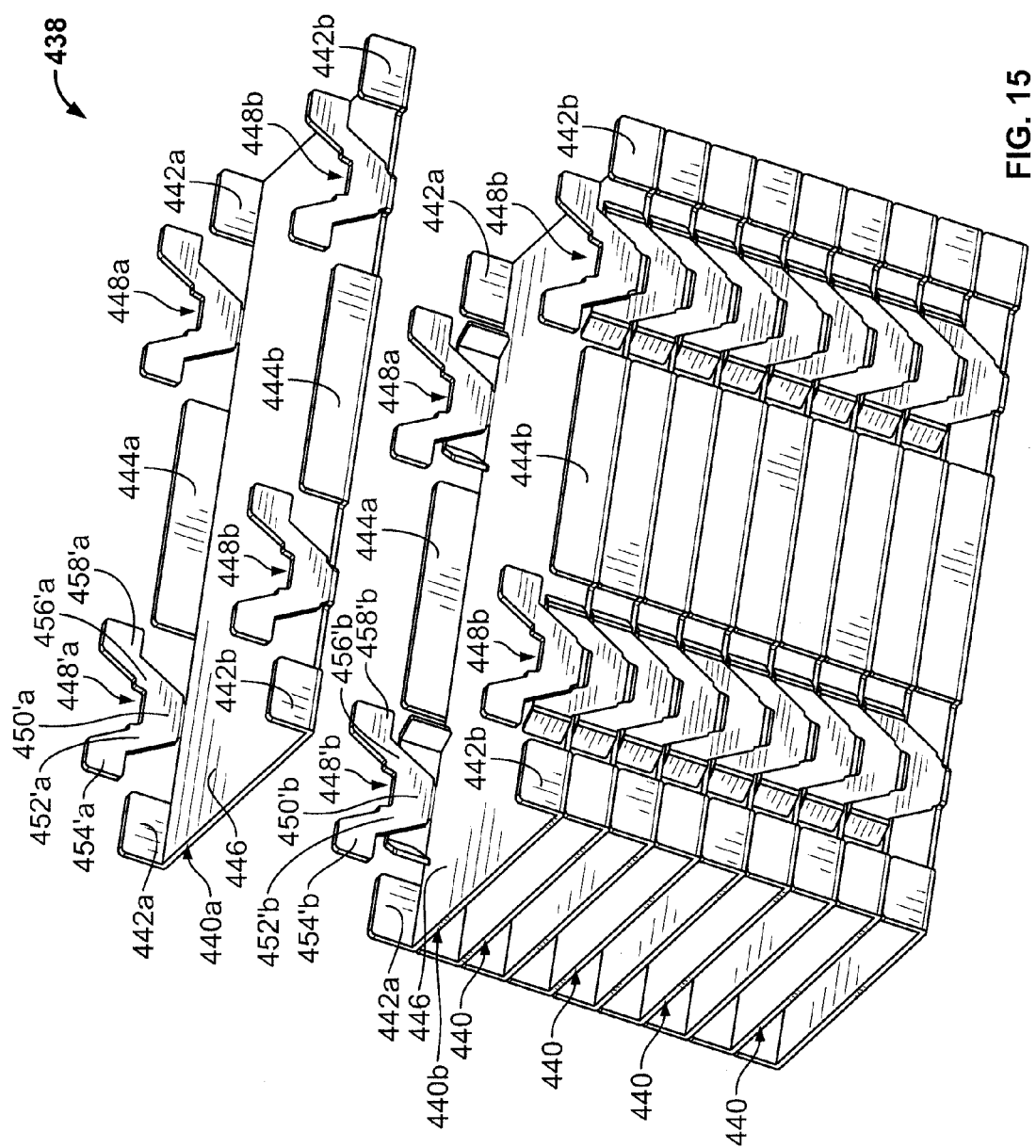
FIG. 15 is a perspective view showing the assembly of one or more stackable fins of a fin array of a EMI/RF shield.

FIG. 15 is a perspective view showing the assembly of one or more stackable fins 440 of the fin array 438. The fins 440 can be stamped from a sheet of metal (e.g., aluminum), thereby forming a wall 446 and tabs (442, 444, and 448) planar with the wall 446, the tabs (442, 444, and 448) can then be bent to be perpendicular with the wall 446. The fins 440 can be attached to the upper surface (not shown) of the shield and interconnected by bending. A first stackable fin 440a having bendable fingers 454'a and 458'a in a planar orientation is stacked onto a second stackable fin 440 having bendable fingers 454'b and 458'b in a planar orientation. The body 450'a of top stackable engagement tab 448'a of first stackable fin 440a is inserted into and past the first arm 452'b and second arm 456'b (and first and second bendable fingers 454'b and 458'b) of a top stackable engagement tab 448'b of second stackable fin 440b. The bottom edge of the body 450'a of the top stackable engagement tab 448'a of the first stackable fin 440a contacts (or is proximate to) the top edge of the body 450'b of the top stackable engagement tab 448'b of the second stackable fin 440b. A top edge of each stackable engagement tab 448 corresponds in shape to a bottom edge of each stackable engagement tab 448 such that the stackable engagement tabs 448 nest with one another when the stackable fins 440 are stacked and interlocked together.

Figure 16:
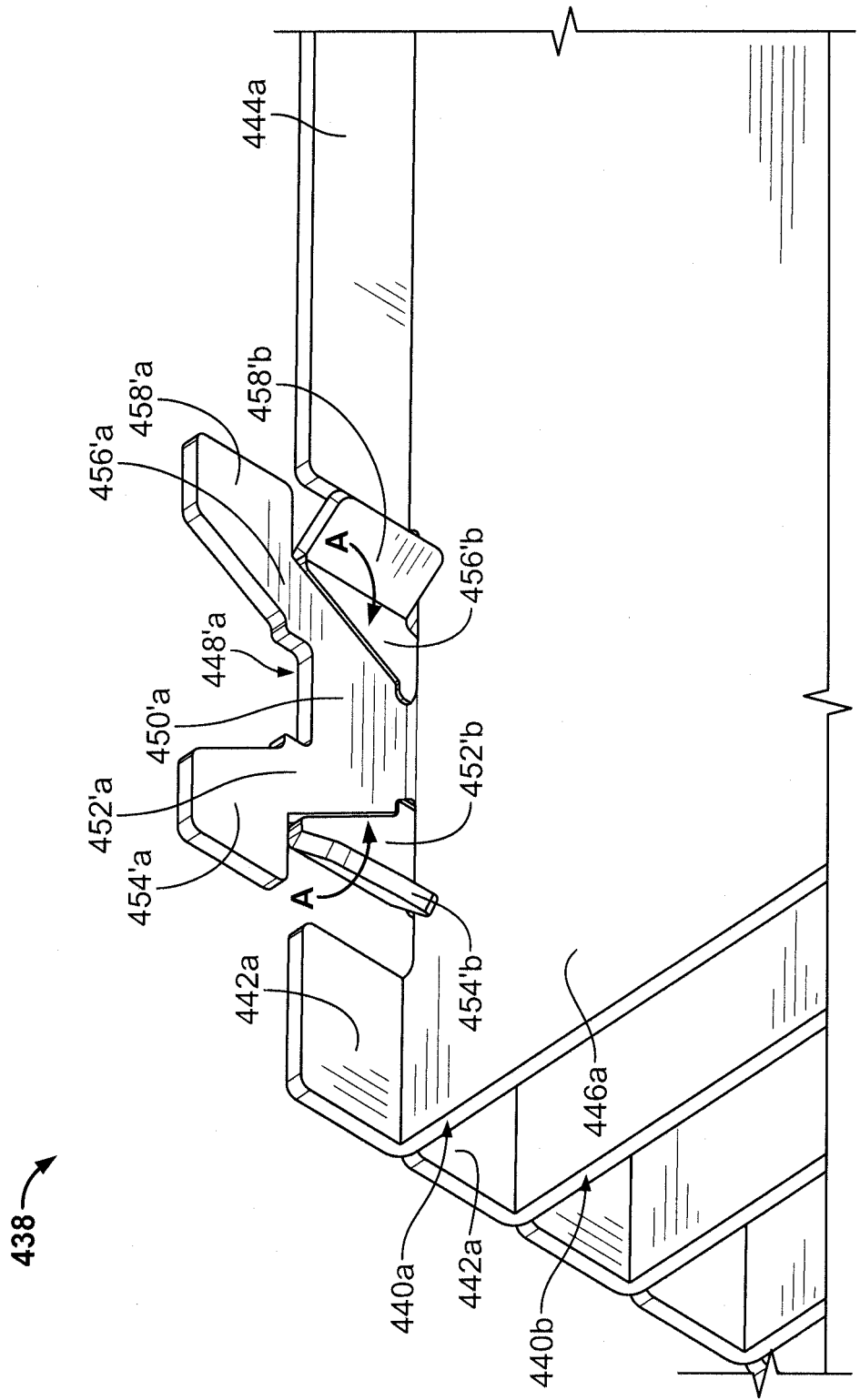
FIG. 16 is a close-up view of the stackable fins of the fin array of FIG. 15.

FIG. 16 is a close-up view of the stackable fins 440 of the fin array 438 of FIG. 15. The edge of the top stackable engagement tab 448'a of the first stackable fin 440a is nested within the area formed by the body 450'a, the first arm 452'a, and second arm 456'a of top stackable engagement tab 448'a. When first stackable fin 440a is stacked onto second stackable fin 440b the bendable fingers 454'a and 458'a of the first stackable fin 440a and bendable fingers 454'b and 458'b of second stackable fin 440b are all in a planar orientation. Once stacked, bendable fingers 454'b and 458'b of the second stackable fin 440b are bent as indicated by the arrows labeled A to engage the wall 446a of the first stackable fin 440a. Thereby the first stackable fin 440a is interlocked with the second stackable fin 440b as the wall 446a of the first stackable fin 440a is sandwiched between bendable fingers 454'b and 458'b of the second stackable fin 440b and end tabs and middle tabs (e.g., end tab 442a) of second stackable fin 440b. The angle at which bendable fingers 454'b and 458'b are bent could vary.

Figure 17:
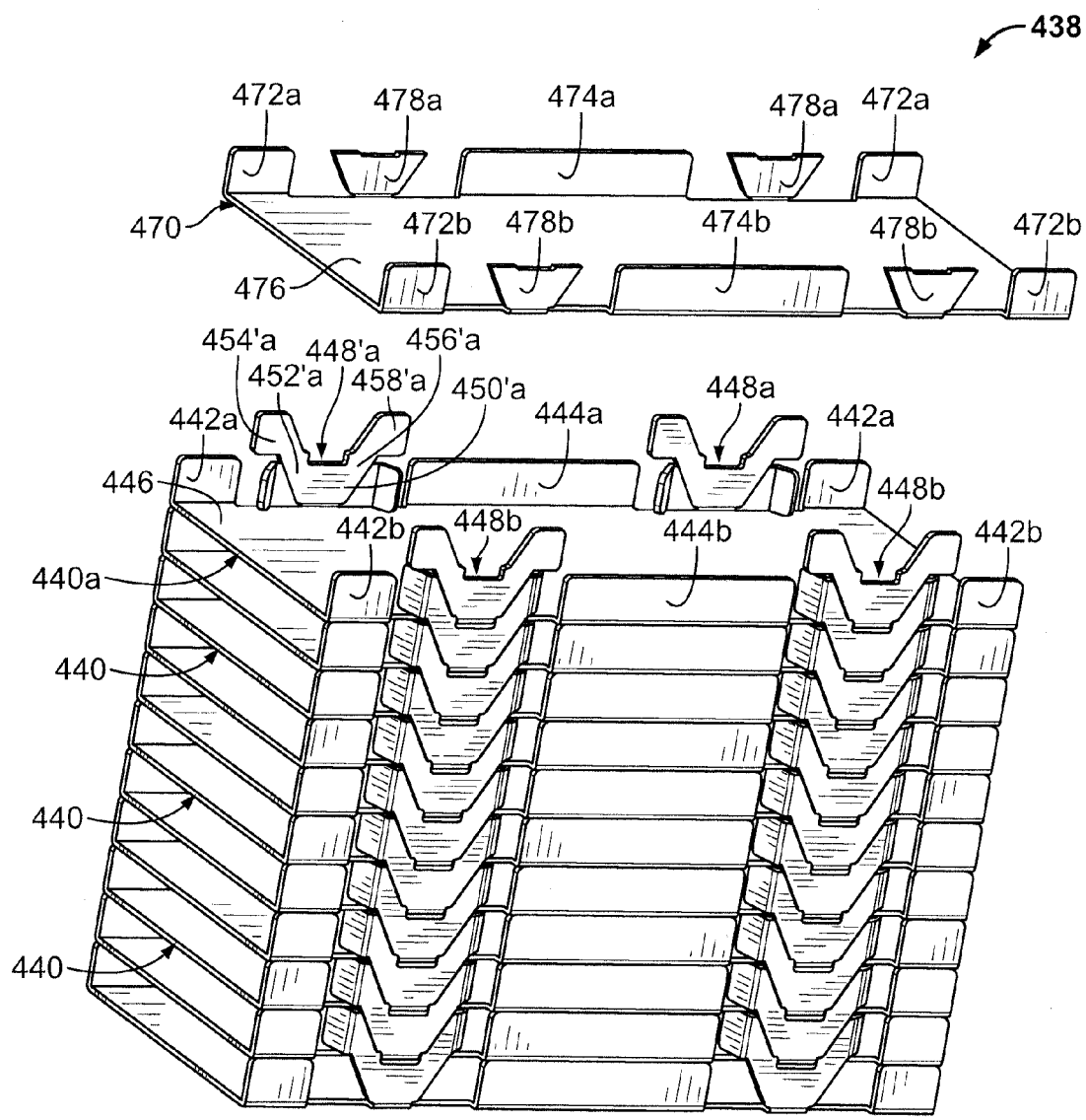
FIG. 17 is a perspective view showing the assembly of an end fin to the fin array.

FIG. 17 is a perspective view showing the assembly of an end fin 470 to the fin array 438. The stackable fins 440 each include a wall 446, top end tabs 442a, bottom end tabs 442b, top and bottom middle tabs 444a and 444b, top stackable engagement tabs 448a, and bottom stackable engagement tabs 448b. As described, the end fin 470 includes a wall 476, top and bottom end tabs 472 (e.g., 472a and 472b), top and bottom middle tabs 474 (e.g., 474a and 474b), and top and bottom stackable end tabs 478 (e.g., 478a and 478b). The tabs (472, 474, and 478) extend from one or more edges of the wall 476 in the same direction. Top and bottom stackable end tabs 478 are trapezoidal in shape to engage with the first and second arms bendable fingers 454'a and 458'a of the first stackable fin 440a. Bendable fingers 454'a and 458'a of the first stackable fin 440a are in a planar orientation. Once stacked, bendable fingers 454'a and 458'a are positioned (e.g., bent) to a bent orientation to engage the wall 476 of the end fin 470 to interlock the end fin 470 with the stackable fins 440. The stackable end tabs 478 interlock the end fin 470 with the plurality of stackable fins 440 by preventing movement (e.g., sliding movement) between the end fin 470 and the first stackable fin 440*a*. A bottom edge of each stackable end tab 478 corresponds in shape to a top edge of each stackable engagement tab 448 of the stackable fin 440 to nest the stackable end tab 478 and stackable engagement tab 448 when interlocked.

Figure 18:
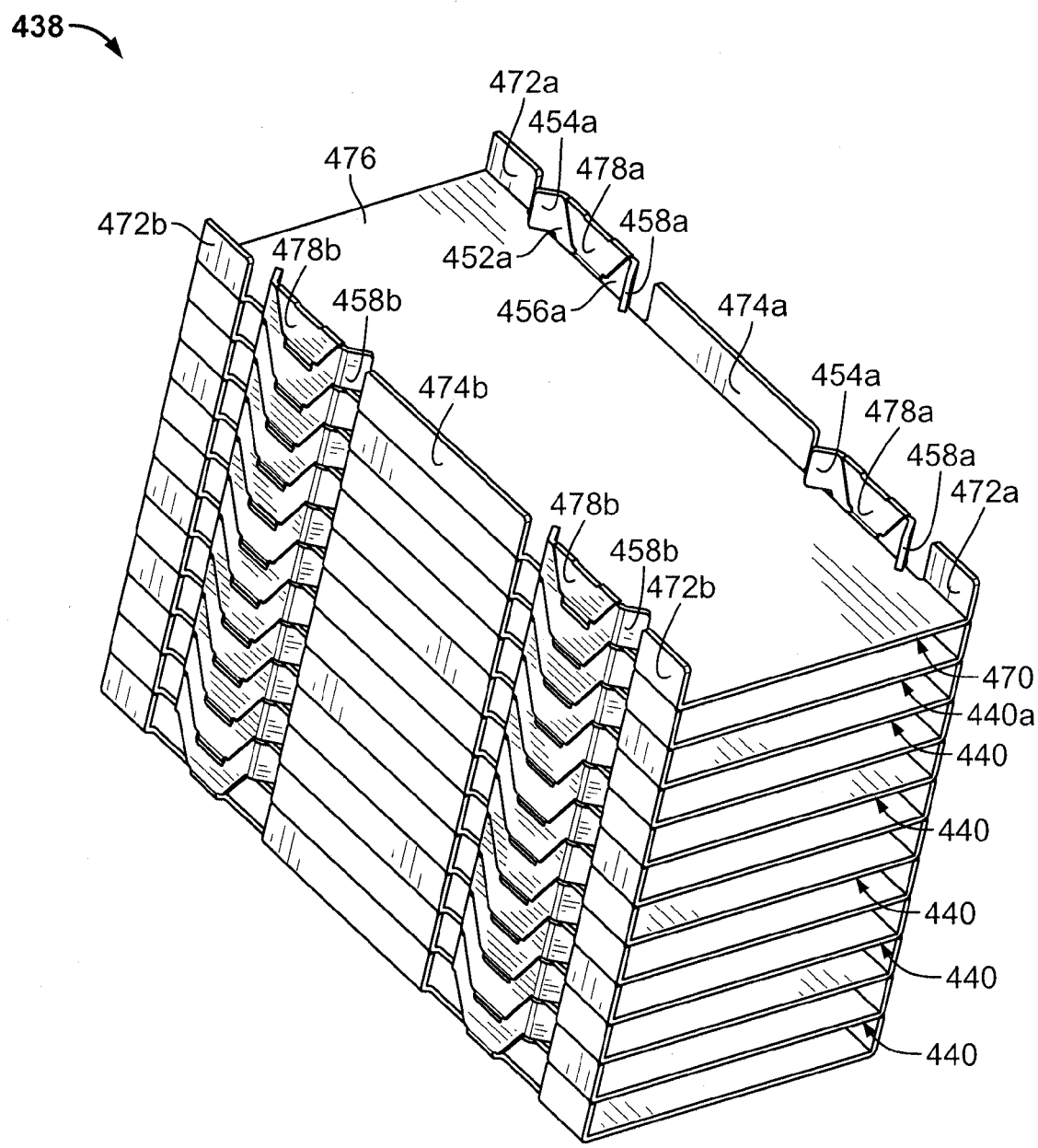
FIG. 18 shows an assembled view of the fin array of a EMI/RF shield.

FIG. 18 shows an assembled view of the fin array 438. The fin array 438 includes a plurality of stackable fins 440 and an end fin 470. The plurality of stackable fins 440 are stacked and function as described in FIGS. 15-16. As described, the end fin 470 includes a wall 476, top and bottom end tabs 472 (e.g., 472*a* and 472*b*), top and bottom middle tabs 474 (e.g., 474*a* and 474*b*), and top and bottom stackable end tabs 478 (e.g., 478*a* and 478*b*). The bendable fingers 454*a* and 458*a* are in a bent orientation securing end fin 470 to fin array 438, thereby preventing movement of the plurality of stackable fins 440. The top edge of the stackable end tabs 478 are flush with the top edges of the bendable fingers 454 and 458 of the first stackable fin 440 once assembled, engaged, and secured.

The edge of the top stackable end tab 478*a* that connects with the wall 476 is nested within the area formed by the body 450*a* (not shown), the first arm 452*a*, and second arm 456*a* of top stackable engagement tab 448*a* (not shown).

When end fin 470 is stacked onto the first stackable fin 440 the bendable fingers 454 and 458 of the first stackable fin 440 are all in a planar orientation. Once stacked, bendable fingers 454 and 458 of the first stackable fin 440 are bent to engage the stackable end tabs 478 of the end fin 470, thereby preventing movement of the end fin 470. The angle at which bendable fingers 454 and 458 are bent could vary.

The fin array 438 can be attached to the upper surface 420 of the shield on a fin by fin basis as the array 438 is formed, or the array 438 can be formed and then attached. The attachment can be by soldering or other known or developed attachment methods.

Having thus described the disclosure in detail, it is to be understood that the foregoing description is not intended to limit the spirit or scope thereof. It will be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure. What is desired to be protected is set forth in the following claims.

What is claimed is:

1. A shield for electronic components on a circuit board comprising:
 a base having an upper surface and one or more sidewalls extending from a perimeter of the upper surface, the sidewalls configured to engage a fence of the circuit board; and
 a fin array attached to the upper surface of the base, the fin array having a plurality of stackable fins, each of the stackable fins having a wall and one or more engagement tabs extending from one or more edges of the wall, the engagement tabs interlocking the plurality of stackable fins together.

2. The shield of claim 1, wherein each of the stackable fins further includes non-engagement tabs to facilitate interlocking, the non-engagement tabs extending from one or more edges of the wall in the same direction as the engagement tabs.

3. The shield of claim 2, wherein the non-engagement tabs comprise top end tabs and a top middle tab extending from a top edge of the wall and bottom end tabs and a bottom middle tab extending from a bottom edge of the wall, and wherein each engagement tab is positioned between an end tab and a middle tab.

4. The shield of claim 1, wherein each engagement tab comprises:
 a body;
 a first arm extending outwardly from the body in a first direction, a first bendable finger extending outwardly from an end of the first arm opposite the body;
 a second arm extending outwardly from the body in a second direction opposite the first direction, a second bendable finger extending outwardly from an end of the second arm opposite the body, the second bendable finger extending opposite from the first bendable finger, the bendable fingers interlocking the stackable fins with one another when the stackable fins are stacked and the bendable fingers are in a bent orientation.

5. The shield of claim 1, wherein a top edge of the engagement tab corresponds in shape to a bottom edge of the engagement tab such that the engagement tabs nest with one another when the stackable fins are stacked and interlocked together.

6. The shield of claim 1, wherein the fin array further comprises an end fin, having stackable end tabs to interlock the end fin with the plurality of stackable fins.

7. The shield of claim 6, wherein the end fin comprises non-engagement tabs to facilitate interlocking, the non-engagement tabs extending from one or more edges of the wall in the same direction as the stackable end tabs.

8. The shield of claim 7, wherein a bottom edge of the stackable end tab corresponds in shape to a top edge of the engagement tab of the stackable fin to nest the stackable end tab and engagement tab when interlocked.

9. The shield of claim 1, wherein the sidewalls of the base include one or more inwardly protruding dimples to engage an outer surface of a fence to secure the shield to the fence.

10. A method for making a shield for electronic components on a circuit board comprising:
 forming a first stackable fin by stamping and bending, wherein the first stackable fin comprises a wall and one or more engagement tabs extending from one or more edges of the wall;
 forming a second stackable fin by stamping and bending, wherein the second stackable fin comprises a wall and one or more engagement tabs extending from one or more edges of the wall;
 stacking the first and second stackable fins;
 bending at least a portion of the engagement tabs of the first stackable fin to interlock the first and second stackable fins together to form a fin array; and
 attaching the fin array to a base to form a shield, the base having an upper surface and one or more sidewalls extending from a perimeter of the upper surface, the sidewalls configured to engage a fence of the circuit board.

11. The method of claim 10, wherein each of the stackable fins comprise non-engagement tabs to facilitate interlocking, the non-engagement tabs extending from one or more edges of the wall in the same direction as the engagement tabs.

12. The method of claim 11, wherein the non-engagement tabs comprise top end tabs and a top middle tab extending from a top edge of the wall and bottom end tabs and a bottom middle tab extending from a bottom edge of the wall, and wherein each engagement tab is positioned between an end tab and a middle tab.

13. The method of claim 10, wherein each engagement tab comprises:
a body;
a first arm extending outwardly from the body in a first direction, a first bendable finger extending outwardly from an end of the first arm opposite the body;
a second arm extending outwardly from the body in a second direction opposite the first direction, a second bendable finger extending outwardly from an end of the second arm opposite the body, the second bendable finger extending opposite from the first bendable finger, the at least a portion of the engagement tabs include the first and second bendable fingers.

14. The method of claim 10, wherein a top edge of the engagement tab corresponds in shape to a bottom edge of the engagement tab such that the engagement tabs nest with one another when the stackable fins are stacked and interlocked together.

15. The method of claim 10, further comprising:
forming an end fin by stamping and bending, the end fin comprises stackable end tabs; and
stacking the end fin with the plurality of stackable fins, wherein bending at least a portion of the engagement tabs of the second stackable fin interlocks the end fin with the plurality of stackable fins to form the fin array.

16. The method of claim 10, wherein the end fin further comprises non-engagement tabs to facilitate interlocking, the non-engagement tabs extending from one or more edges of the wall in the same direction as the stackable end tabs.

17. The method of claim 10, wherein a bottom edge of the stackable end tab corresponds in shape to a top edge of the engagement tab of the stackable fin to nest the stackable end tab and engagement tab when stacked and interlocked.

18. The method of claim 10, wherein each of the sidewalls of the base comprise one or more inwardly protruding dimples to engage an outer surface of a fence to secure the shield to the fence.

* * * * *

UNITED STATES PATENT AND TRADEMARK OFFICE
CERTIFICATE OF CORRECTION

| | | |
|---|---|---|
| PATENT NO. | : 9,603,292 B2 | Page 1 of 1 |
| APPLICATION NO. | : 14/967970 | |
| DATED | : March 21, 2017 | |
| INVENTOR(S) | : Arthur Kurz, Michael Schneider and Bret Barry | |

It is certified that error appears in the above-identified patent and that said Letters Patent is hereby corrected as shown below:

On the Title Page

Under the Inventors (Item (72)), Michael Schneider's state of residence should be listed as "NY"

The Assignee (Item (73)) should be listed as "A.K. Stamping Company, Inc., Mountainside, NJ (US)"

Signed and Sealed this
Sixth Day of February, 2018

Joseph Matal
*Performing the Functions and Duties of the*
*Under Secretary of Commerce for Intellectual Property and*
*Director of the United States Patent and Trademark Office*